(12) United States Patent
Penney et al.

(10) Patent No.: US 10,535,387 B2
(45) Date of Patent: Jan. 14, 2020

(54) DQS GATING IN A PARALLELIZER OF A MEMORY DEVICE

(71) Applicant: Micron Technology, Inc., Boise, ID (US)

(72) Inventors: Daniel B. Penney, Wylie, TX (US); Liang Chen, Allen, TX (US)

(73) Assignee: Micron Technology, Inc., Boise, ID (US)

(*) Notice: Subject to any disclaimer, the term of this patent is extended or adjusted under 35 U.S.C. 154(b) by 81 days.

(21) Appl. No.: 15/891,353

(22) Filed: Feb. 7, 2018

(65) Prior Publication Data

US 2019/0244645 A1    Aug. 8, 2019

(51) Int. Cl.
| | | |
|---|---|---|
| G11C 7/00 | (2006.01) |
| G11C 8/18 | (2006.01) |
| G11C 7/10 | (2006.01) |
| G06F 5/06 | (2006.01) |
| G06F 13/42 | (2006.01) |
| G11C 29/50 | (2006.01) |
| G06F 13/16 | (2006.01) |

(52) U.S. Cl.
CPC ............... *G11C 8/18* (2013.01); *G06F 5/06* (2013.01); *G06F 13/1689* (2013.01); *G06F 13/4234* (2013.01); *G11C 7/1036* (2013.01); *G11C 7/1051* (2013.01); *G11C 7/1087* (2013.01); *G11C 7/1093* (2013.01); *G11C 29/50012* (2013.01); *G11C 2207/107* (2013.01)

(58) Field of Classification Search
CPC ....... G11C 8/18; G11C 7/1051; G11C 7/1093; G06F 5/06; G06F 13/1689
USPC ............................ 365/193, 189.05, 189.45
See application file for complete search history.

(56) References Cited

U.S. PATENT DOCUMENTS

| | | | | |
|---|---|---|---|---|
| 8,121,237 B2* | 2/2012 | Stott | ............. | G11C 7/1051 365/193 |
| 8,630,131 B1* | 1/2014 | Shiao | ............. | G11C 5/04 326/30 |
| 2004/0264291 A1 | 12/2004 | Shim | | |
| 2005/0175120 A1* | 8/2005 | Gater | ............. | H04L 25/4902 375/316 |
| 2009/0222713 A1 | 9/2009 | Shin et al. | | |

(Continued)

OTHER PUBLICATIONS

PCT International Search Report & Written Opinion for PCT Application No. PCT/US2018/056332 dated Jan. 31, 2019; 14 Pages.

*Primary Examiner* — Connie C Yoha
(74) *Attorney, Agent, or Firm* — Fletcher Yoder, P.C.

(57) ABSTRACT

Memory devices and methods include receiving data at an input buffer and outputting serial data. The serial shift data is passed toward a serial shift register that shifts its stored data into a data write bus in a parallel format. Serial shift register loading circuitry controls loading of a serial shift register. The serial shift register loading circuitry is configured to receive a data strobe signal and provide the data strobe to the serial shift register to cause the serial shift register to shift in the serial data during a write operation. The serial register loading circuitry includes gating circuitry that is configured to cutoff provision of the data strobe from the serial register loading circuitry based at least in part on a load signal that indicates that the data write bus has been loaded with the serial data in a parallel format.

21 Claims, 5 Drawing Sheets

(56) References Cited

U.S. PATENT DOCUMENTS

| | | | |
|---|---|---|---|
| 2012/0026806 A1* | 2/2012 | Kwon | G11C 7/1078 365/189.07 |
| 2014/0029331 A1 | 1/2014 | Gopalakrishnan et al. | |
| 2016/0365135 A1 | 12/2016 | Gopalan et al. | |

* cited by examiner

DQS GATING IN A PARALLELIZER OF A MEMORY DEVICE

BACKGROUND

Field of the Present Disclosure

Embodiments of the present disclosure relate generally to the field of semiconductor devices. More specifically, embodiments of the present disclosure relate to cutting off a potentially ringing data strobe for a write operation using data strobe gating in a parallelizer of a memory device.

Description of Related Art

Semiconductor devices (e.g., memory devices) utilize timing with phase shifts of data signals, data strobes, and/or other signals to perform operations. When an internal data pulse (DQS) path of a memory device is long, there may be sufficient time to complete a serial-to-parallel conversion of incoming serial data accompanying the DQS signal after a last write bit of a write operation without catching spurious edges of an undriven DQS signal propagating to circuitry performing the serial-to-parallel conversion. Some specifications for memory devices may require the internal DQS path to be short. However, as this path is shortened, the shutdown of propagation of the DQS signal becomes more difficult to complete during a write postamble of a write operation. The write postamble is an amount of time from when a last write bit is captured by a last falling edge of a DQS signal until an indeterminate/invalid state for the DQS signal due to an external controller ceasing to drive the DQS signal externally. As a further restriction on the DQS signal timing, some specifications for memory devices for the postamble may be small exacerbating timing difficulties for memory devices to meet such specifications. If the internal timing exceeds the specified window, data (e.g., during serial-to-parallel conversion) may be corrupted.

Embodiments of the present disclosure may be directed to one or more of the problems set forth above.

BRIEF DESCRIPTION OF DRAWINGS

FIG. 3 is a schematic diagram of DQS cutoff circuitry that includes the parallelizer of FIG. 1 having a serial shift register and serial register loading circuitry, in accordance with an embodiment;

DETAILED DESCRIPTION

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

As previously noted, a write postamble for a memory device is an amount of time from a last write bit captured by a last falling edge of a data strobe (DQS) signal until the DQS signal is returned to an indeterminate or invalid tri-state due to an external controller ceasing to drive the DQS external to the memory device. A double data rate type five synchronous dynamic access memory (DDR5 SDRAM) device may include a specification of DDR5 that includes at least one write postamble requirement that is short (e.g., 0.5 tCK). This window may be difficult to meet due to the difficulty in shutting off an internal DQS signal in the specified short window. After this short window, an external DQS signal used to generate the internal DQS may be allowed to transition to the indeterminate or invalid tri-state. If the internal DQS signal is not shut off in this short window, then the tri-state of the external DQS signal may inadvertently cause asserted edges in the internal DQS signal after the short window when the internal DQS is to remain unchanging. This improper assertion on the internal DQS signal may cause corruption of internal data. As discussed herein, the disclosed technique of gating off the internal DQS path immediately after a last write bit has bit captured may be used to reduce a postamble size sufficient to satisfy the short postamble specification. Since the gating off of the DQS path occurs relatively close to the parallelizer and relatively few delays are used, this gating may enable reduced postamble lengths while ensuring that the serial-to-parallel conversion of data may occur properly, as discussed herein.

Figure 1:
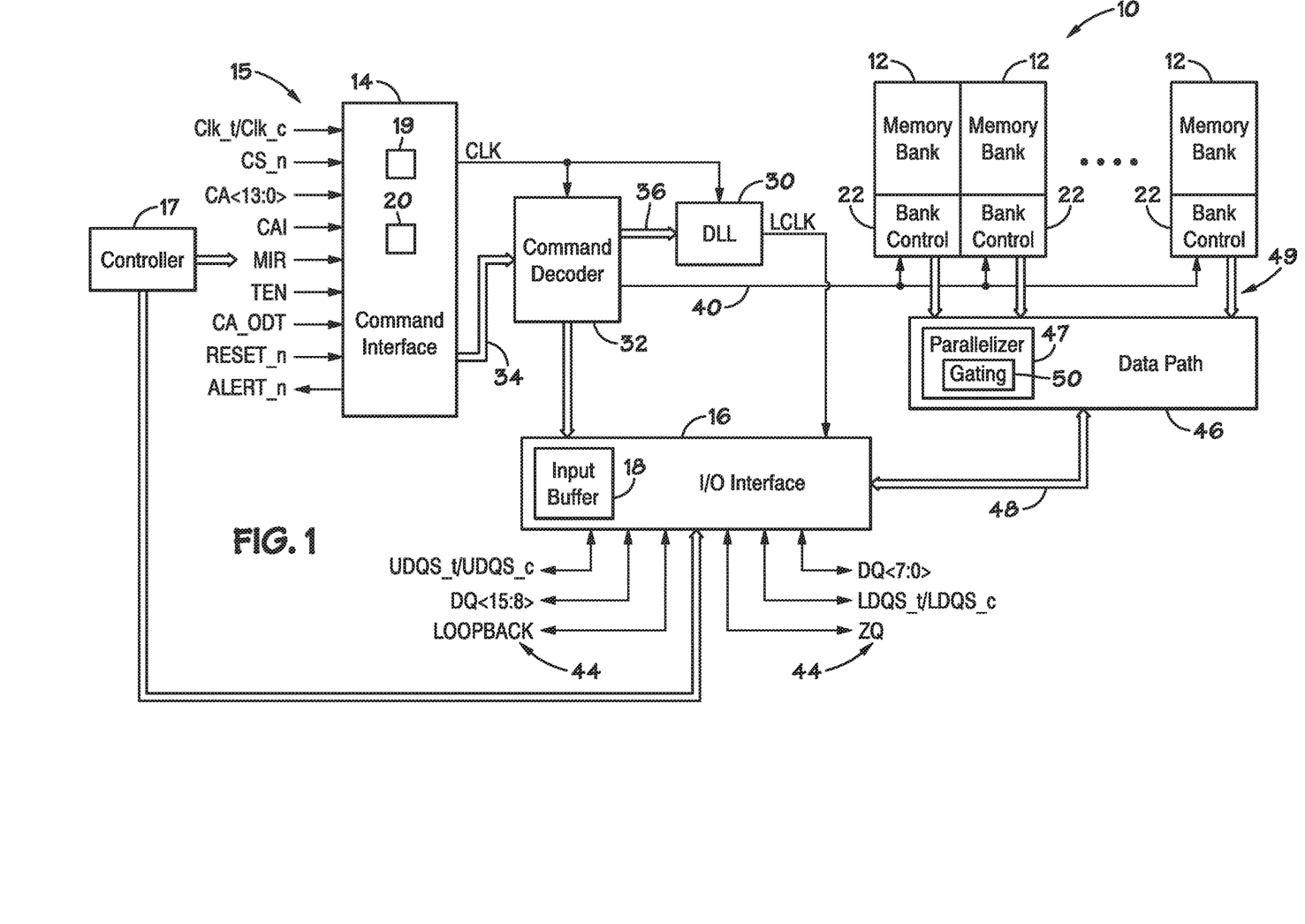
FIG. 1 is a simplified block diagram illustrating certain features of a memory device having gating circuitry in a parallelizer used to convert serial data to parallel data, according to an embodiment of the present disclosure.

Turning now to the figures, FIG. 1 is a simplified block diagram illustrating certain features of a memory device 10. Specifically, the block diagram of FIG. 1 is a functional block diagram illustrating certain functionality of the memory device 10. In accordance with one embodiment, the memory device 10 may be a DDR5 SDRAM device. Various features of DDR5 SDRAM allow for reduced power consumption, more bandwidth and more storage capacity compared to prior generations of DDR SDRAM.

The memory device 10, may include a number of memory banks 12. The memory banks 12 may be DDR5 SDRAM memory banks, for instance. The memory banks 12 may be provided on one or more chips (e.g., SDRAM chips) that are arranged on dual inline memory modules (DIMMS). Each DIMM may include a number of SDRAM memory chips (e.g., x8 or x16 memory chips), as will be appreciated. Each SDRAM memory chip may include one or more memory banks 12. The memory device 10 represents a portion of a single memory chip (e.g., SDRAM chip) having a number of memory banks 12. For DDR5, the memory banks 12 may be further arranged to form bank groups. For instance, for an 8 gigabyte (Gb) DDR5 SDRAM, the memory chip may include 16 memory banks 12, arranged into 8 bank groups, each bank group including 2 memory banks. For a 16 Gb DDR5 SDRAM, the memory chip may include 32 memory banks 12, arranged into 8 bank groups, each bank group including 4 memory banks, for instance. Various other configurations, organization and sizes of the memory banks 12 on the memory device 10 may be utilized depending on the application and design of the overall system.

The memory device 10 may include a command interface 14 and an input/output (I/O) interface 16. The command interface 14 is configured to provide a number of signals (e.g., signals 15) from an external device, such as a processor or controller 17. The IO interface 16 includes an input buffer 18 that buffers incoming data. The processor or controller 17 may provide various signals 15 to the memory device 10 to facilitate the transmission and receipt of data to be written to or read from the memory device 10.

As will be appreciated, the command interface 14 may include a number of circuits, such as a clock input circuit 19 and a command address input circuit 20, for instance, to ensure proper handling of the signals 15. The command interface 14 may receive one or more clock signals from an external device. Generally, double data rate (DDR) memory utilizes a differential pair of system clock signals, referred to herein as the true clock signal (Clk_t) and the bar clock signal (Clk_c). The positive clock edge for DDR refers to the point where the rising true clock signal Clk_t crosses the falling bar clock signal Clk_c, while the negative clock edge indicates that transition of the falling true clock signal Clk_t and the rising of the bar clock signal Clk_c. Commands (e.g., read command, write command, etc.) are typically entered on the positive edges of the clock signal and data is transmitted or received on both the positive and negative clock edges.

The clock input circuit 19 receives the true clock signal (Clk_t) and the bar clock signal (Clk_c) and generates an internal clock signal CLK. The internal clock signal CLK is supplied to an internal clock generator, such as a delay locked loop (DLL) circuit 30. The DLL circuit 30 generates a phase controlled internal clock signal LCLK based on the received internal clock signal CLK. The phase controlled internal clock signal LCLK is supplied to the I/O interface 16, for instance, and is used as a timing signal for determining an output timing of read data.

The internal clock signal(s)/phases CLK may also be provided to various other components within the memory device 10 and may be used to generate various additional internal clock signals. For instance, the internal clock signal CLK may be provided to a command decoder 32. The command decoder 32 may receive command signals from the command bus 34 and may decode the command signals to provide various internal commands. For instance, the command decoder 32 may provide command signals to the DLL circuit 30 over the bus 36 to coordinate generation of the phase controlled internal clock signal LCLK. The phase controlled internal clock signal LCLK may be used to clock data through the IO interface 16, for instance.

Further, the command decoder 32 may decode commands, such as read commands, write commands, mode-register set commands, activate commands, etc., and provide access to a particular memory bank 12 corresponding to the command, via the bus path 40. As will be appreciated, the memory device 10 may include various other decoders, such as row decoders and column decoders, to facilitate access to the memory banks 12. In one embodiment, each memory bank 12 includes a bank control block 22 which provides the necessary decoding (e.g., row decoder and column decoder), as well as other features, such as timing control and data control, to facilitate the execution of commands to and from the memory banks 12.

The memory device 10 executes operations, such as read commands and write commands, based on the command/address signals received from an external device, such as a processor. In one embodiment, the command/address bus may be a 14-bit bus to accommodate the command/address signals (CA<13:0>). The command/address signals are clocked to the command interface 14 using the clock signals (Clk_t and Clk_c). The command interface may include a command address input circuit 20 which is configured to receive and transmit the commands to provide access to the memory banks 12, through the command decoder 32, for instance. In addition, the command interface 14 may receive a chip select signal (CS_n). The CS_n signal enables the memory device 10 to process commands on the incoming CA<13:0> bus. Access to specific banks 12 within the memory device 10 is encoded on the CA<13:0> bus with the commands.

In addition, the command interface 14 may be configured to receive a number of other command signals. For instance, a command/address on die termination (CA_ODT) signal may be provided to facilitate proper impedance matching within the memory device 10. A reset command (RESET_n) may be used to reset the command interface 14, status registers, state machines and the like, during power-up for instance. The command interface 14 may also receive a command/address invert (CAI) signal which may be provided to invert the state of command/address signals CA<13:0> on the command/address bus, for instance, depending on the command/address routing for the particular memory device 10. A mirror (MIR) signal may also be provided to facilitate a mirror function. The MIR signal may be used to multiplex signals so that they can be swapped for enabling certain routing of signals to the memory device 10, based on the configuration of multiple memory devices in a particular application. Various signals to facilitate testing of the memory device 10, such as the test enable (TEN) signal, may be provided, as well. For instance, the TEN signal may be used to place the memory device 10 into a test mode for connectivity testing.

The command interface 14 may also be used to provide an alert signal (ALERT_n) to the system processor or controller for certain errors that may be detected. For instance, an alert signal (ALERT_n) may be transmitted from the memory device 10 if a cyclic redundancy check (CRC) error is detected. Other alert signals may also be generated. Further, the bus and pin for transmitting the alert signal (ALERT_n) from the memory device 10 may be used as an input pin during certain operations, such as the connectivity test mode executed using the TEN signal, as described above.

Data may be sent to and from the memory device 10, utilizing the command and clocking signals discussed above, by transmitting and receiving data signals 44 through the IO interface 16. More specifically, the data may be sent to or retrieved from the memory banks 12 over the datapath 46, which includes multiple bi-directional data buses. Data IO signals, generally referred to as DQ signals, are generally transmitted and received in one or more bi-directional data busses using the input buffer 18. The datapath 46 may include a parallelizer 47 that converts the DQ signals from a serial bus 48 to a parallel bus 49. As discussed below in relation to FIG. 3, the parallelizer 47 may include gating circuitry 50 that blocks the potential propagation of the DQS signal after a write operation is completed but before the parallelizer 47 may capture spurious edges of an undriven DQS from the controller 17.

For certain memory devices, such as a DDR5 SDRAM memory device, the IO signals may be divided into upper and lower bytes. For instance, for a ×16 memory device, the IO signals may be divided into upper and lower IO signals (e.g., DQ<15:8> and DQ<7:0>) corresponding to upper and lower bytes of the data signals, for instance.

To allow for higher data rates within the memory device 10, certain memory devices, such as DDR memory devices may utilize data strobe signals, generally referred to as DQS signals. The DQS signals are driven by the external processor or controller sending the data (e.g., for a write command) or by the memory device 10 (e.g., for a read command). For read commands, the DQS signals are effectively additional data output (DQ) signals with a predetermined pattern. For write commands, the DQS signals are used as clock signals to capture the corresponding input data. As with the clock signals (Clk_t and Clk_c), the DQS signals may be provided as a differential pair of data strobe signals (DQS_t and DQS_c) to provide differential pair signaling during reads and writes. For certain memory devices, such as a DDR5 SDRAM memory device, the differential pairs of DQS signals may be divided into upper and lower data strobe signals (e.g., UDQS_t and UDQS_c; LDQS_t and LDQS_c) corresponding to upper and lower bytes of data sent to and from the memory device 10, for instance.

The DQS signals are driven by the controller 17 to the memory device 10 to strobe in write data. When the write operation is complete, the controller 17 will stop driving the DQS and allow it to float to an indeterminate tri-state condition. When the DQS signal is no longer driven by the controller 17, the external DQS signal from the controller 17 to the memory device 10 will be at an unknown/indeterminate state. This state can cause undesirable behavior inside the memory device 10 because an internal DQS signal inside the memory device 10 may be at an intermediate level and/or may oscillate. In some embodiments, even the external DQS signal may ring at the I/O interface 16 when the controller 17 stops driving the external DQS signal.

As previously discussed and discussed in more detail below, the memory device 10 may attempt to disable all of the write circuitry after the end of the write operation as quickly as possible, to avoid false write data from being passed to the serial shift register as discussed below in relation to FIG. 3. As discussed in relation to FIGS. 2A and 2B, the DDR5 specification may include a short postamble period where the external DQS signal is still driven by the controller 17 after the last write data bit to allow time for disabling of write circuitry to propagate before the controller 17 ceases to drive the external DQS signal. The DDR5 specification may define a short (e.g., 0.5 tCK) postamble period and a long (e.g., 1.5 tCK) postamble period that may be selected using a mode register. However, the short postamble period may provide a short period of time to disable write circuitry prior to the controller 17 ceasing to drive external DQS signal. As discussed below in relation to FIG. 3 and the following figures, gating circuitry 50 in the DQS path in the datapath 46 may disable propagation of the DQS signal to write circuitry (e.g., serial-to-parallel conversion circuitry) early enough in the DQS pathing that the internal disabling of the DQS signal is completed before the controller 17 stops driving the external DQS signal potentially causing spurious edges to be propagated to the write circuitry.

Returning to FIG. 1, an impedance (ZQ) calibration signal may also be provided to the memory device 10 through the 10 interface 16. The ZQ calibration signal may be provided to a reference pin and used to tune output drivers and ODT values by adjusting pull-up and pull-down resistors of the memory device 10 across changes in process, voltage and temperature (PVT) values. Because PVT characteristics may impact the ZQ resistor values, the ZQ calibration signal may be provided to the ZQ reference pin to be used to adjust the resistance to calibrate the input impedance to known values. As will be appreciated, a precision resistor is generally coupled between the ZQ pin on the memory device 10 and GND/VSS external to the memory device 10. This resistor acts as a reference for adjusting internal ODT and drive strength of the IO pins.

In addition, a loopback signal (LOOPBACK) may be provided to the memory device 10 through the IO interface 16. The loopback signal may be used during a test or debugging phase to set the memory device 10 into a mode wherein signals are looped back through the memory device 10 through the same pin. For instance, the loopback signal may be used to set the memory device 10 to test the data output (DQ) of the memory device 10. Loopback may include both a data and a strobe or possibly just a data pin. This is generally intended to be used to monitor the data captured by the memory device 10 at the IO interface 16.

As will be appreciated, various other components such as power supply circuits (for receiving external VDD and VSS signals), mode registers (to define various modes of programmable operations and configurations), read/write amplifiers (to amplify signals during read/write operations), temperature sensors (for sensing temperatures of the memory device 10), etc., may also be incorporated into the memory device 10. Accordingly, it should be understood that the block diagram of FIG. 1 is only provided to highlight certain functional features of the memory device 10 to aid in the subsequent detailed description.

Figure 2A:
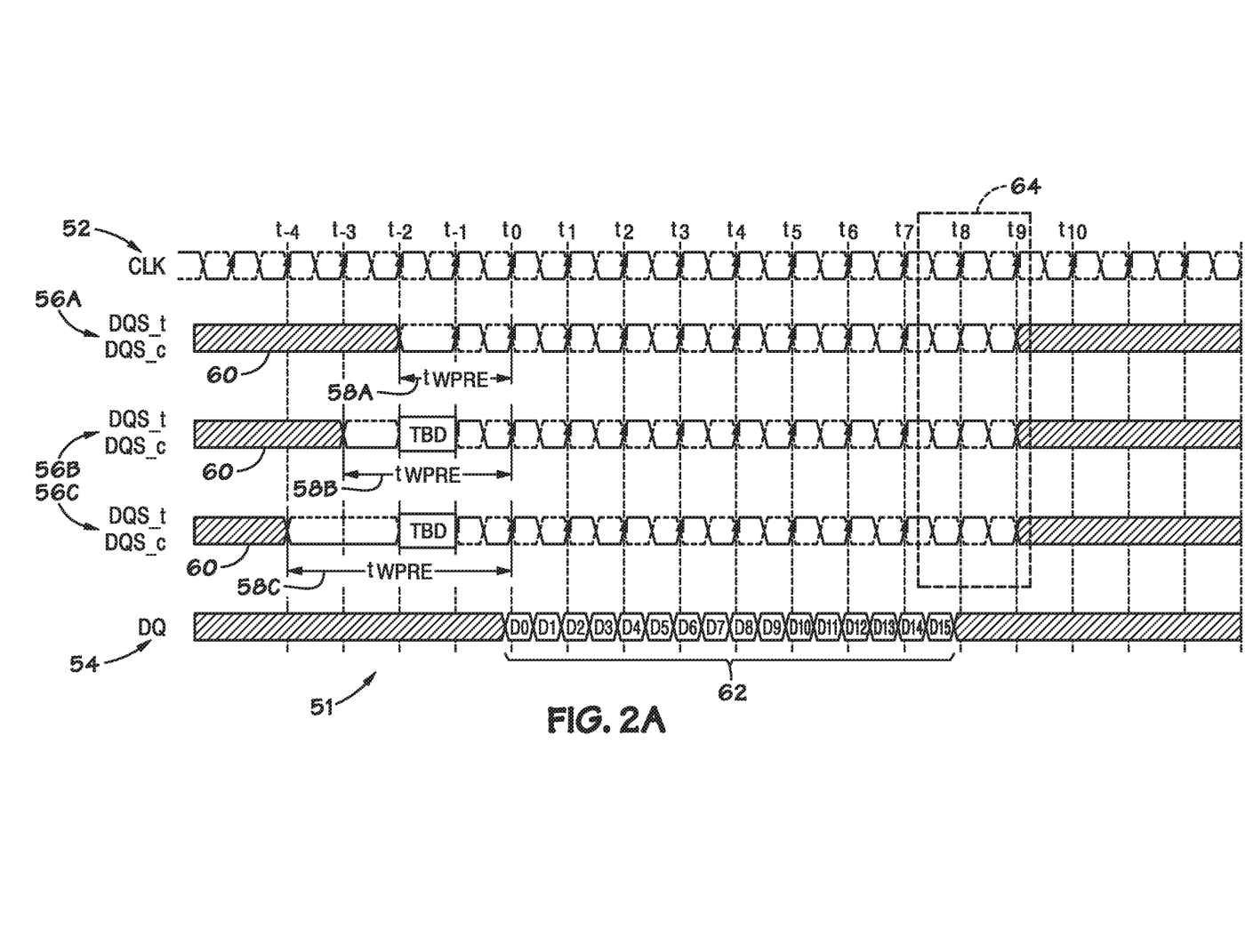
FIG. 2A is a timing diagram including a clock for the memory device of FIG. 1 using a long postamble, in accordance with an embodiment.
Figure 2B:
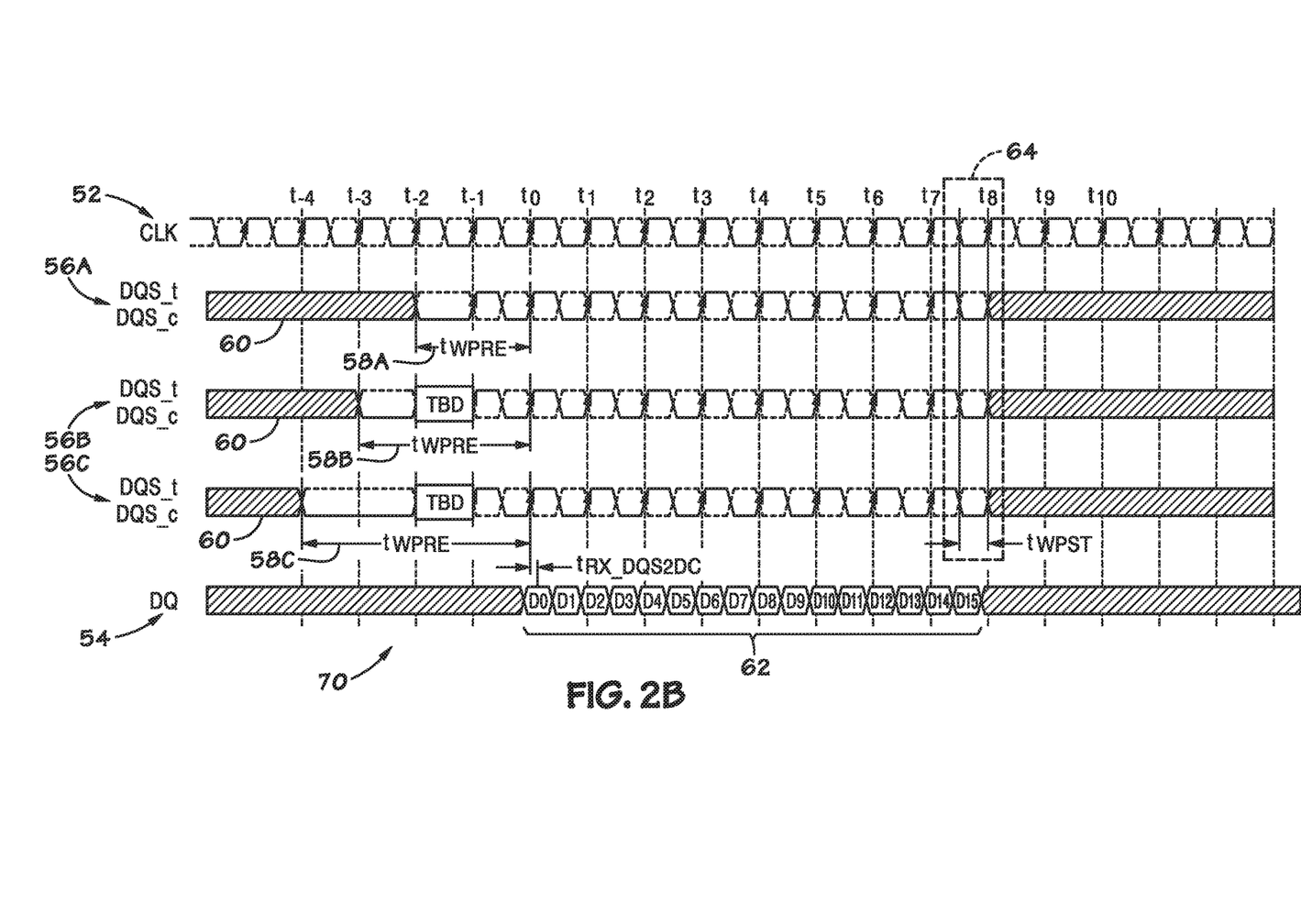
FIG. 2B is a timing diagram including a clock for the memory device of FIG. 1 using a short postamble, in accordance with an embodiment.

FIG. 2A illustrates a timing diagram 51 including a clock 52 for the memory device 10 that may be specified in the DDR5 specification. The timing diagram 51 also includes potential DQS signals 56A, 56B, and 56C that may be used to capture data transmitted in a data signal 54. The potential DQS signal 56A includes a 2-cycle preamble 58A, the potential DQS signal 56B includes a 3-cycle preamble 58B, and the potential DQS signal 56C includes a 4-cycle preamble 58C. In some embodiments, other potential DQS signals may have other preamble lengths. Regardless of length, the preambles 58A, 58B, and 58C include a period between an indeterminate tri-state 60 and a data period 62 where data is transmitted via the data signal 54. The timing diagram 51 also shows that each of the potential DQS signals 56A, 56B, and 56C includes a write postamble 64 of 0.5 tCK where the controller 17 still drives an external DQS signal used to generate the appropriate potential DQS signal 56A, 56B, or 56C after the data period 62 before the controller 17 ceases driving the external DQS signal. Similarly, FIG. 2B illustrates a timing diagram 70 that is similar to the timing diagram 51 of FIG. 2A. However, as illustrated in the timing diagram 70, the write postamble may be a short preamble of 0.5 tCK.

In some embodiments, the gating circuitry 50 may be used to gate the internal DQS path in the parallelizer 47 after the input buffer 18 in the internal DQS path after a write operation. This gating may prevent spurious DQS edges and/or the indeterminate state of the external DQS signal from propagating to any circuitry anywhere else in the memory device 10. However, it may be difficult to cause a disable signal to functionally respond fast enough to stop the DQS signal in the internal DQS path before it causes data corruption in write circuitry. The parallelizer 47 is one of the write circuits that may be particularly vulnerable to spurious DQS edges that cause data corruption due to the short internal DQS path and/or the short postamble length.

FIG. 3 is a schematic diagram of DQS cutoff circuitry 80 that includes the parallelizer 47. As illustrated, the input buffer 18 receives a DQ signal 82 and a DQS signal 84 from the controller 17. In some embodiments, the DQ signal 82 and/or the DQS signal 84 may be amplified or adjusted from an external DQ signal and/or the DQS provided by the controller directly. For example, one or more inverting amplifiers may be included to boost an amplitude of the external DQ signal and/or the DQS to account for loading fanout in the memory device 10. The input buffer 18 buffers serial data 86 from the DQ signal 82 using the DQS signal 84. The serial data 86 is passed to the parallelizer 47. The parallelizer 47 includes serial register loading circuitry 88 that includes the gating circuitry 50. When the gating circuitry 50 enables passing the DQS signal 84, the parallelizer 47 loads the serial data 86 in a serial shift register 90 that then passes the data into serial-to-parallel conversion circuitry 92 that passes parallel data 94 to the parallel registers 96. The parallel data 94 eventually is stored in the memory banks 12.

Figure 4:
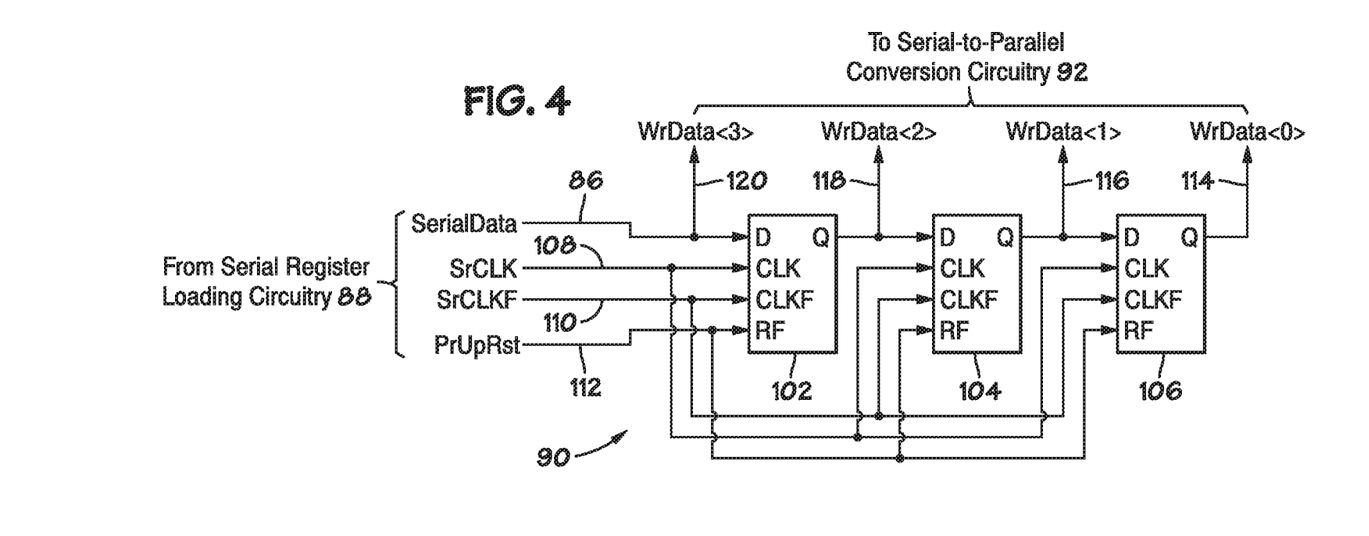
FIG. 4 is a schematic diagram of serial shift register of FIG. 3, in accordance with an embodiment.

FIG. 4 is a schematic diagram of an embodiment of the serial shift register 90. The serial shift register 90 includes flip flops 102, 104, and 106. The flip flops 102, 104, and 106 receive an SrClk signal 108 and a complementary SrClkf signal 110 to pass the serial data 86 sequentially through the flip flops 102, 104, and 106 from the input buffer 18. The flip flops 102, 104, and 106 may also utilize a PwrUpRst signal 112 that resets the flip flops when the memory device 10 is powering up. The SrClk signal 108 and the complementary SrClkf signal 110 may be received from the serial register loading circuitry 88. Moreover, as discussed below in relation to FIG. 5, the SrClk signal 108 and the complementary SrClkf signal 110 may both be derived from the DQS signal 84. Accordingly, spurious edges in the DQS signal 84 may cause data corruption in the serial shift register 90 and/or potentially other write circuitry of the memory device.

The number of flip flops included in the serial shift register 90 may be a function of a bit length of a write operation and/or a number of phases used to shift the bits of a write operation into the memory banks 12. For example, when the write operation has a 16-bit prefetch and uses four divided phases for a prefetch, each phase includes four bits. In such an embodiment, the serial shift register 90 includes three flip flops 102, 104, and 106. The three flip flops 106, 104, and 102 respectively output write bits WrData<0> 114, WrData<1> 116, and WrData<2> 116. The other bit, WrData<3> 120, to be dealt with by the serial shift register 100 may be unshifted in the flip flops 102, 104, and 106 and delivered directly from the input buffer 18 to the serial-to-parallel conversion circuitry 92 on a parallel formatted data write (DW) bus.

Figure 5:
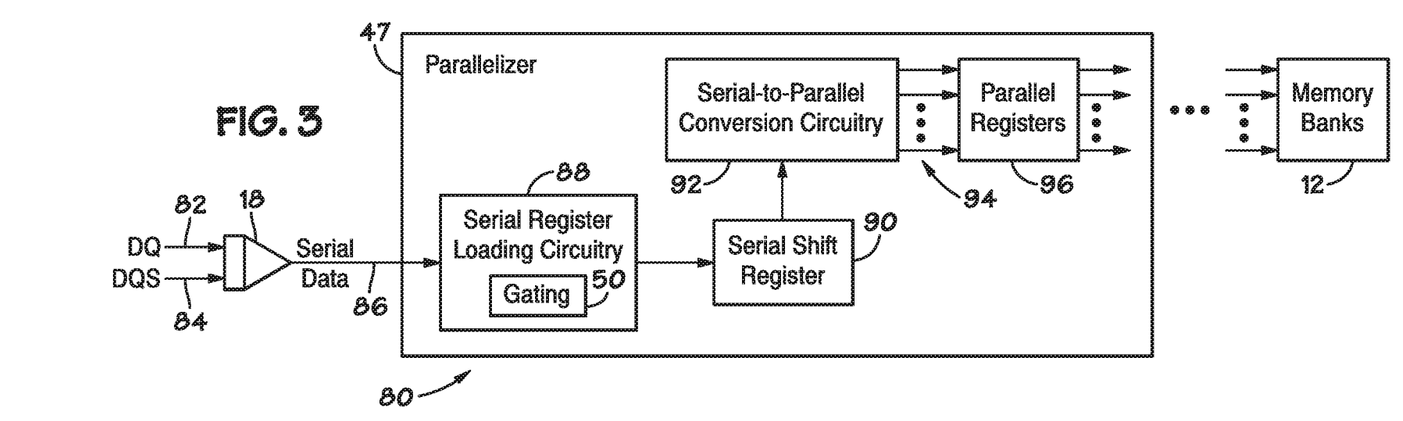
FIG. 5 is a schematic diagram of the serial register loading circuitry of FIG. 3 having the gating circuitry of FIG. 1, in accordance with an embodiment.

FIG. 5 is a schematic diagram of the serial register loading circuitry 88 used to pass the SrClk signal 108 and SrClkf signal 110 to the serial shift register 90. As previously discussed, the serial register loading circuitry 88 includes gating circuitry 50. The gating circuitry 50 includes an OR gate 130 and a NAND gate 132 that receives a data strobe false (DSF) signal 134, a gapless write signal 136, and a gating signal 138. The DSF signal 134 is a logical complement of the DQS signal 84. Since the DSF signal 134 is used for a unidirectional aspect (e.g., a write operation), the "Q" is omitted from "DQS" of the DSF signal 134. The gapless write signal 136 indicates that consecutive write operations are occurring/to occur. The gapless write signal 136 prevents the gating circuitry 50 from disabling passing of the DSF signal 134 using the gating signal 138. The gating signal 138 is a voltage that controls whether the DSF signal 134 is passed to the serial shift register 90 or cut-off from the serial shift register 90.

Since the DSF signal 134 is a logical complement to the DQS signal 84, the DSF signal 134 is a function of the DQS signal 84. Similarly, when the gapless write signal 136 and the gating signal 138 enable passing of the DSF signal 134, the SrClk signal 108 is a function of the DSF signal 134. The SrClkf signal 110 may be generated from the SrClk signal 108 using an inverter 139. Accordingly, the SrClkf signal 110 is also a function of the DSF signal 134. Thus, the SrClk signal 108 and the SrClkf signal 110 are both functions of the DQS signal 84. The gating circuitry 50 selectively cuts off the DQS signal 84 from propagating as the SrClk signal 108 and/or the SrClkf signal 110 to the serial shift register 90 to prevent data corruption in the serial shift register 90.

In some embodiments, a gating function of the gating circuitry 50 may be functionally disabled using selection circuitry 140 that selects whether to apply a voltage 142 and/or a gating voltage 144 to the OR gate 130. The selection circuitry 140 may include a multiplexer that selects between the voltage 142 and the gating voltage 144. Additionally or alternatively, a controlled switch may merely select between connecting the gating voltage 144 to the OR gate 130 and disconnecting the gating voltage 144 from the OR gate 130. In other words, the selection circuitry 140 makes the gating function of the gating circuitry 50 optional for the serial register loading circuitry 88.

The gating circuitry 50 is controlled using gating control circuitry 146. The gating control circuitry 146 receives a DWload signal 148 that indicates an end of a burst. On a cycle before a last bit of the write operation is latched, the DWload signal 148 is asserted upon a falling edge of the DSF signal 134. When the DSF signal 134 then transitions high, a latch 150 passes the DWload signal 148 signal through. This passing of the DWload signal 148 occurs on transitioning of the DSF signal 134 due to connection of the latch 150 to the SrClkf signal 110 to latch pins of the latch 150. One of the connections to the latch pins utilizes an inverter 151 to provide complementary latching signals (functionally equivalent to SrClk signal 108 and SrClkf signal 110) to the latch 150. Furthermore, this latching may be delayed by passing the SrClkf signal 110 through delay 152. The latch may be reset using the PwrUpRst signal 112. The PwrUpRst signal 112 and the gating voltage 144 are passed into a NAND gate 153 whose output is connected to the reset pin of the latch 150 via an inverter 154.

The output of the latch 150 (e.g., the DWload signal 148) is passed to a NOR gate 156 so that the next and final falling edge of the DSF signal 134 corresponding to write data after the DWload signal 148 will enable passing through the NOR gate 156 as a flipping clock 158. The flipping clock 158 may also be inverted using an inverter 160 to generate an inverted flipping clock 162. The flipping clock 158 and the inverted flipping clock 162, due to the final falling edge of the DSF signal 134, triggers a flip flop 164 to output a DWlatchanddrv signal 166 that causes loading of the shift register data out of the serial shift register into the DW bus as parallel data.

Thus, the latch 150 delays until the final trigger from when the DWload signal 148 asserts on the next-to-the-last cycle, to the last cycle so that the final write data bit is latched from the input buffer 18 and shifted into the WrData<3> 120 position for the immediate parallel load onto the DW bus. The latch 150 also prevents the DSF signal 134 from passing through the NOR gate 156 until the last bit has been latched. This prevention of perpetual passing of the DSF signal 134 until the last bit has been latched saves power due to unnecessary gate toggling on every other cycle of the write burst.

In some embodiments, the write operation may include a cyclic redundancy check (CRC) bit. When a CRC function is included, a next cycle after the final falling edge of the DSF signal 134 corresponding to write data may be used for an additional bit. Accordingly, when CRC is enabled, the DWlatchanddrv signal 166 causes a CRC flip flop 168 to output a CRClatchanddrv signal 170 on the next cycle after the final falling edge of the DSF signal 134 corresponding to write data.

The CRC function may be enabled using a CRCEnF 172 that indicates whether CRC is enabled with a logic low corresponding to a CRC enable. The CRCEnF 172 may be inverted using an inverter 174 to generate a CRCEn 176. Further, to increase amplitude for fanout loading, the CRCEn 176 may pass through an inverting amplifier 178 to produce an amplified version of the CRCEnF 172 for propagation through the serial register loading circuitry 88.

In addition to driving the DW bus, the DWlatchanddrv signal 166 feeds back into a multiplexer 179 to immediately disable passing of the DSF signal 134 through the gating circuitry 50. The multiplexer 179 includes an AND gate 180 that receives the DWlatchanddrv signal 166 and the CRCEnF 172. Thus, the AND gate 180 outputs a logic high when CRC is disabled and the data is being/has been driven in the DW bus as indicated in the DWlatchanddrv signal 166. The multiplexer 179 also includes an AND gate 182 that receives the CRClatchanddrv signal 170 and the CRCEn 176. Thus, the AND gate 182 outputs a logic high when CRC in enabled and the CRC bit is being driven as indicated by the CRClatchanddrv signal 170. The outputs of the AND gate 180 and the AND gate 182 are passed into a NOR gate 184 to generate the gating voltage 144 that, along with the gapless write signal 136, controls the gating function of the gating circuitry 50, as previously discussed. Thus, the DWlatchanddrv signal 166 (or the CRClatchanddrv signal 170) may cut off propagation of the DSF signal 134 using the gating circuitry 50 to prevent ringing on the DSF signal 134 due to the controller 17 stopping driving of the external DQS signal to the memory device 10 after the write operation. As previously noted, cutting off propagation of the DSF signal 134 prevents false data from being latched into the serial shift register 90 before loading on the DW bus. Furthermore, this cutting off of the DSF signal 134 is performed quickly due to a relatively small number of gates (e.g., NOR gate 156, flip flop 164, CRC flip flop 168, and gating circuitry 50) used to cut off the DSF signal 134 after the write operation is completed while saving power using the NOR gate 156 and latch 150 as previously discussed.

The flip flop 164 may be reset using a reset signal 185 to prepare the flip flop 164 for a next write operation. The reset signal 185 may be controlled by reset circuitry 186. The reset circuitry 186 may receive a DWloadComplete signal 188. The DWloadComplete signal 188 indicates that the parallel load and drive of the DW bus from the serial shift register 90 has been completed. The reset circuitry 186 uses the DWloadComplete signal 188 and an inverted DWload 189 that is generated from the DWload signal 148 using an inverter 190 to generate the reset signal 185. The reset circuitry 186 includes an AND gate 191 that receives the CRCEn 176 and an inverted CRClatchanddrv 192 that is generated from the CRClatchanddrv signal 170 using an inverter 194. Thus, the AND gate 191 outputs a logic high when CRC is enabled and the CRClatchanddrv signal 170 is not asserted. The output of the AND gate 191 is input to a NOR gate 198 along with the DWloadComplete signal 188. The NOR gate 198 outputs a logic high when the DWloadComplete signal 188 is a logic low except when the output of the AND gate 191 is a logic high indicating that CRC is enabled and the CRClatchanddrv signal 170 is not asserted. The NOR gate 198 is output to an AND gate 200 that suppresses pass-through of the output of the NOR gate 198 when the DWload signal 148 is asserted high. The output of the AND gate 200 is passed to a NOR gate 202 along with a PwrUpRstF signal 204 that is a logical complement to the PwrUpRst signal 112. Using these connections, the NOR gate 202 generates the reset signal 185 that controls a reset of the flip flop 164.

The serial register loading circuitry 88 also includes CRC reset circuitry 206 that may be used to reset the CRC flip flop 168. The CRC reset circuitry 206 receives the PwrUpRst signal 112. In some embodiments, the CRC reset circuitry 206 may generate the PwrUpRstF signal 204 from the PwrUpRst signal 112 using an inverter 210 to propagate the PwrUpRstF signal 204 to other parts (e.g., the NOR gate 202) of the serial register loading circuitry 88. The CRC reset circuitry 206 also receives a CRCloadComplete 212 that indicates that CRC loading has been completed. The PwrUpRst signal 112 and the CRCloadComplete 212 are passed to a NAND gate 214 that outputs a logic high unless PwrUpRst signal 112 is a logic high and CRC has completed. The output of the NAND gate 214 is passed to a NOR gate 216. The NOR gate 216 outputs a logic high only when CRC is not enabled, the PwrUpRst signal 112 is asserted high, and CRC loading has been completed. The output of the NOR gate 216 is used to control resets of the CRC flip flop 168. When CRC is enabled, a reset of the CRC flip flop 168 propagates to the CRClatchanddrv signal 170 that then propagates to the reset signal 185 via the AND gate 191. Thus, when CRC is enabled, the CRClatchanddrv signal 170 resets the CRC flip flop 168 in addition to enabling the flip flop 164 to be reset after the CRC bit has been driven. Similarly, as previously noted, the multiplexer 179 does not allow the DWlatchanddrv signal 166 to shut off the DSF signal 134 when CRC is enabled. Instead, the multiplexer 179 waits until the CRClatchanddrv signal 170 is toggled on a next cycle.

Although the foregoing discusses various logic-low and/or logic-high assertion polarities, at least some of these polarities may be inverted in some embodiments. Furthermore, in some embodiments, logic gates as discussed herein may be replaced with similar logical functions, such as an inverter replaced with a single NAND gate or other similar changes.

While the present disclosure may be susceptible to various modifications and alternative forms, specific embodiments have been shown by way of example in the drawings and have been described in detail herein. However, it should be understood that the present disclosure is not intended to be limited to the particular forms disclosed. Rather, the present disclosure is intended to cover all modifications, equivalents, and alternatives falling within the spirit and scope of the present disclosure as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. A memory device, comprising:
an input buffer configured to receive data and output serial data;
a serial shift register configured to output the serial data in a parallel format on a data write bus; and
serial register loading circuitry configured to receive a data strobe signal and provide the data strobe to the serial shift register to cause the serial shift register to shift in the serial data during a write operation, wherein the serial register loading circuitry comprises gating circuitry configured to cutoff provision of the data strobe from the serial register loading circuitry to the serial shift register based at least in part on a load signal that indicates that the data write bus has been loaded with the serial data in a parallel format to prevent shifting of the serial data into the serial shift register while the provision of the data strobe is cut off.

2. The memory device of claim 1, wherein the serial register loading circuitry comprises power saving circuitry that reduces power loading for the serial register loading circuitry until a data burst is complete.

3. The memory device of claim 1, wherein the serial data shifted into the serial shift register comprises only a portion of a number of bits transferred in a prefetch.

4. The memory device of claim 3, wherein the data strobe is one of a plurality of phase-divided data strobes resulting from an external data strobe signal.

5. The memory device of claim 4, wherein a number of the portion of the number comprises the number divided by a number of the plurality of phase-divided data strobes.

6. The memory device of claim 1, wherein the gating circuitry receives a gating voltage that is selectively based at least in part on the load signal.

7. The memory device of claim 6, wherein the serial register loading circuitry comprises selection circuitry that selects whether to supply a feedback voltage as the gating voltage.

8. The memory device of claim 7, wherein the selection circuitry comprises a switch that selectively connects the gating voltage to the gating circuitry.

9. The memory device of claim 8, wherein the selection circuitry comprises a multiplexer that selects between the gating voltage and another voltage to connect to the gating circuitry.

10. The memory device of claim 9, wherein the serial register loading circuitry comprises a multiplexer that selects the load signal between a first load signal and a second load signal.

11. The memory device of claim 10, wherein the first load signal indicates that data bits of the write operation have been loaded.

12. The memory device of claim 11, wherein the second load signal indicates that a cyclic redundancy check bit has been loaded.

13. The memory device of claim 12, wherein the first and second load signals are selected between by the multiplexer based at least in part on a cyclic redundancy check enable signal.

14. A method, comprising:
receiving a data strobe at serial register loading circuitry having gating circuitry;
during a write operation, passing the data strobe through the gating circuitry to a serial shift register;
passing data from the serial shift register to a data write bus;
determining whether the write operation has completed; and
upon determining that the write operation has completed and using gating circuitry, blocking the data strobe from passing from the serial register loading circuitry to the serial shift register to keep the serial shift register from shifting in data due to an indeterminate state of the data strobe.

15. The method of claim 14, comprising receiving the data strobe from a controller external to a memory device that includes the serial register loading circuitry.

16. The method of claim 15, wherein the indeterminate state results from the controller ceasing to drive the data strobe.

17. The method of claim 14, wherein determining whether the write operation is completed comprises determining whether a cyclic redundancy check is enabled.

18. The method of claim 17, wherein determining whether the write operation is completed comprises determining whether all data bits to be written to memory cells in a transfer have been shifted to the data write bus when the cyclic redundancy check is not enabled.

19. The method of claim 17, wherein determining whether the write operation is completed comprises determining whether all data bits to be written to memory cells in a transfer have been shifted to the data write bus when the cyclic redundancy check is not enabled.

20. A memory device comprising:
plurality of memory cells;
a serial shift register configured to load data into a data write bus to the plurality of memory cells;
gating circuitry configured to receive a data strobe and to pass the data strobe to the data write bus to capture data to be written in the plurality of memory cells as part of a write operation;
a data write flip flop configured to receive the data strobe at its clock pin on a last cycle of writing the data in the write operation and to toggle a load signal at its output only on the last cycle of writing the data; and
feedback circuitry configured to feed the load signal back to the gating circuitry to cause the gating circuitry to cut off the data strobe from the serial shift register to keep the serial shift register from shifting in the data until after the write operation has been completed.

21. The memory device of claim 20, comprising a cyclic redundancy check flip flop configured to receive the load signal from the data write flip flop and to toggle a cyclic redundancy check load signal that, when cyclic redundancy is enabled for the memory device, suppresses a reset of the data write flip flop until the cyclic redundancy check load signal has toggled.

* * * * *